(12) United States Patent
Kim et al.

(10) Patent No.: US 8,416,604 B2
(45) Date of Patent: Apr. 9, 2013

(54) METHOD OF IMPLEMENTING MEMRISTOR-BASED MULTILEVEL MEMORY USING REFERENCE RESISTOR ARRAY

(75) Inventors: Hyongsuk Kim, Albany, CA (US); Leon O. Chua, Berkeley, CA (US)

(73) Assignees: Industrial Cooperation Foundation Chonbuk National University, Jeonbuk (KR); The Regents of the University of California, Oakland, CA (US)

( * ) Notice: Subject to any disclaimer, the term of this patent is extended or adjusted under 35 U.S.C. 154(b) by 162 days.

(21) Appl. No.: 13/009,969

(22) Filed: Jan. 20, 2011

(65) Prior Publication Data

US 2011/0182104 A1    Jul. 28, 2011

(51) Int. Cl.
  *G11C 11/00* (2006.01)
(52) U.S. Cl.
  USPC ............ 365/148; 365/100; 365/129; 365/163
(58) Field of Classification Search ............. 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 977/754
  See application file for complete search history.

(56) References Cited

U.S. PATENT DOCUMENTS

| | | | |
|---|---|---|---|
| 7,359,888 B2 | 4/2008 | Snider | |
| 2011/0038196 A1* | 2/2011 | Tour et al. | 365/148 |
| 2012/0069622 A1* | 3/2012 | Parkinson et al. | 365/145 |

OTHER PUBLICATIONS

Chao, et al., Multilevel memory based on molecular devices, Applied Physics Letters, vol. 84, (Mar. 2004).
Chua, et al., Memristive Devices and Systems, Proceedings of the iEEE, vol. 64, (Feb. 1976).
Williams, How We Found the Missing Memristor, IEEE Spectrum, (Dec. 2008).
Snider, Self-organized computation with Unreliable, Memristive Nanodevices, IOC Publishing Ltd., (2007).
Bauer, et al., A Multilevel-Cell 32Mb Flash Memory, IEEE (1995).
Greene, A Memory Breakthrough, Technology review (Feb. 2008).
Pirovano, et al., Reliability Study of Phase-Change Nonvolatile Memories, IEEE (Sep. 2004).
Ielmini, et al., Recovery and Drift Dynamics of Resistance and Threshold Voltages in Phase-Change Memories, IEEE (Feb. 2007).
Park, et al., Resistance Switching Characteristics for Nonvolatile Memory Operation of binary Metal Oxides, Japanese Journal o Applied Physics, vol. 46 (2007).
Lee et al., Resistance Switching of Copper Doped $MOO_x$ films for nonvolatile memory applications, Applied Physics Letters 90, (2007).
Stukov, et al., the Missing Memristor Found, Nature (2008).
Chua, et al., Memristor—The Missing Circuit Element, IEEE (Sep. 1971).

* cited by examiner

Primary Examiner — Harry W Byrne
(74) Attorney, Agent, or Firm — Fulbright & Jaworski LLP

(57) ABSTRACT

The present invention relates to a memristor, and more particularly, to a method of implementing a memristor-based multilevel memory using a reference resistor array and a write-in circuit and a read-out/restoration circuit for the memristor-based multilevel memory, in which a memristor can be used as a multilevel memory. In the present invention, a reference resistance value is written in a selected memristor of a memristor array by applying repeatedly the current pulses of which widths are proportional to the difference between the resistances of the selected memristor and the selected node of the reference resistor array.

6 Claims, 8 Drawing Sheets

(a)

(b)

(a)

METHOD OF IMPLEMENTING MEMRISTOR-BASED MULTILEVEL MEMORY USING REFERENCE RESISTOR ARRAY

GOVERNMENT SUPPORT

This invention was made with government support under Grant Number N00014-09-1-0411 awarded by the U.S. Office of Naval Research. The government has certain rights in the invention.

RELATED APPLICATIONS

This application claims the benefit under 35 U.S.C. §119(e) of U.S. Ser. No. 61/336,740 filed Jan. 26, 2010, which is incorporated herein by reference in its entirety for all purposes.

BACKGROUND OF THE INVENTION

1. Field of the Invention

The present invention relates to memristors, and more particularly, to a method of implementing memristor-based multilevel memories using a reference resistor array, a memristor array, a write-in circuit and a read-out/restoration circuit.

2. Background of the Related Art

In anticipating the end of Moore's law a decade from now, many new approaches to extend the end of this law have been proposed by the memory industry. One approach is to develop the Multi-Level Cell (MLC) technology which stores multiple bits in a multilevel form of information [1], [2] in a memory element. Commercially available MLC NAND memories can store four states per cell in the current technology. Most approaches are the transistor-based PRAM (Phase Change RAM) [3], [4], and [5], except HP's resistance-based RRAM [6], [7]. Recently, Stanley Williams et al. from HP had developed a remarkable memory element, called the memristor, which is based on the pinched hysteresis loop exhibited by Titanium Dioxide thin films [8], when sandwiched between Platinum electrodes.

There are several advantages of the memristor memory over conventional transistor-based memories. One is its strikingly small size. Though memristor is still at its early development stage, its size is at most one tenths of its RAM counterparts [11]. If the fabrication technology for memristor is improved more, the size advantage could be even more significant. Another feature of the memristor is its incomparable potential to store analog information, which enables the memristor to keep multiple bits of information in a memory cell [9], [10]. Besides these features, the memristor is also an ideal device for implementing synaptic weights in artificial neural networks [12], [13].

Despite many favorable features, memristors have several weaknesses in practice. One weakness comes from the non-linearity in the φ vs. q curve, which makes it difficult to determine the proper pulse width for achieving a desired resistance value. If the nonlinearity is spatially a variant in the die of a chip, which is common in the fabrication process, the difficulty could be very serious. Another difficulty comes from the property of the memristor which integrates any kind of signals, including noise, which appeared at the memristor and results in the memristors being perturbed from its original pre-set values.

[References]

[1] Chao Li, Wendy Fan, Bo Lei, Daihua Zhang, Song Han, Tao Tang, Xiaolei Liu, Zuqin Liu, Sylvia Asano, Meyya Meyyappan, Jie Han and Chongwu Zhoub, "Multilevel memory based on molecular devices," Applied Physics Letters 84, 1949 (2004)

[2] M. Bauer, R. Alexis, G. Atwood, B. Battar, A. Fazio, K. Frary, M. Hensel, M. Ishac, J. Javanifard, M. Landgraf, D. Leak, K. Loe, D. Mills, P. Ruby, R. Rozman, S. Sweha, S. Talreja, K. Wojciwhowski, "A multilevel-Cell 32 Mb Flash Memory," ISSCC95, paper TA 7.7 page 132, 1995.

[3] Kate Greene, A Memory Breakthrough, Technology Review, 4 Feb. 2008

[4] Pirovano, A. Redaelli, A. Pellizzer, F. Ottogalli, F. Tosi, M. Ielmini, D. Lacaita, A. L. Bez, R. Reliability study of phase-change nonvolatile memories. IEEE Transactions on Device and Materials Reliability. Sep. 2004, vol 4, issue 3, pp. 422-427.

[5] D. Ielmini et al., IEEE Trans. Electron Dev. vol. 54, 308-315 (2007).

[6] S. Park et al., Jap. J. Appl. Phys. vol. 46, pp. 2172-2174 (2007).

[7] D. Lee et al., "Resistance switching of copper doped MoOx films for nonvolatile memory applications", Appl. Phys. Lett. 90, 122104 (2007)

[8] Strukov, D. B., Snider, G. S., Stewart, D. R. Williams, R. S. The Missing Memristor Found. Nature 453, 80-83 (2008).

[9] Chua, L. O., "Memristor—The missing circuit element," IEEE Trans. Circuit Theory CT-18, 507-519 (1971).

[10] Leon O. Chua and Sung Mo Kang, "Memristive Devices and Systems," Proceedings of the IEEE, Vol. 64, No. 2, pp. 209-223, Feb., 1976

[11] R. Stanley Williams, "How We Found the Missing Memristor," IEEE Spectrum, pp. 1-14, Dec. 2008.

[12] G Snider, "Self-organized computation with unreliable, memristive nanodevices," Nanotechnology vol. 18, 365202, pp. 1-13, 2007

[13] G Snider, Molecular-junction-nanowire-crossbar-based neural network, U.S. Pat. No. 7,359,888 B2.

SUMMARY OF THE INVENTION

Accordingly, the present invention has been made in view of the above problems occurring in the prior art, and it is an object of the present invention to provide a method of implementing memristor-based multilevel memories using a reference resistor array 120, wherein a reference resistor array 120 is prepared and the resistance information stored in each memristor is adjusted so that it becomes equal to a reference resistance value.

To achieve the above object, according to an embodiment of the present invention, there is provided a method of implementing a memristor-based multilevel memory using a reference resistor array 120, comprising the steps in a way making a resistance value of the memristor selected from among memristors of a memristor array equal to the reference resistance value of a node selected from among nodes of the reference resistor array, writing the reference resistance value in the selected memristor; and when the reference resistance value written in the selected memristor is deviated from the originally stored resistance value, restoring the resistance value of the selected memristor to the originally stored resistance value by making the resistance value of the selected memristor equal to the closest reference resistance value among all the nodes of the reference resistor array.

Here, the memristor are all the resistance-based memories, in which ReRAM and RRAM are included. The reference resistor array 120 can be implemented by connecting a plurality of resistors in series or forming tabs in middle of a resistant line so that a resistor serial connection effect can be realized. The reference resistance value at the selected node of a reference resistor array is the sum of resistances from a ground to the selected node.

Furthermore, the steps of writing the reference resistance value in the selected memristor can comprise the steps of applying the same currents $i_s(t)$ to both the reference resistor array and the selected memristor of the memristor array (Step a) and applying a programming current pulse $i_P(t)$ to the selected memristor of the memristor array 130 and repeating from step a (Step b) if the absolute difference value between the voltage of the selected node of the reference resistor array and the voltage of the selected memristor of the memristor array is larger than a predetermined threshold.

The step of applying the programming current pulses iP(t) to the selected memristor comprises the steps of generating the current pulse iP(t) whose pulse width is proportional to the difference between the voltage of the selected memristor and that of the selected node among the nodes of reference resistor array and applying the current pulses iP(t) to the selected memristor in a direction in which the resistance value of the selected memristor approaches the resistance of the selected node of reference resistor array.

The step of read-out the resistance value of the selected memristor of the memristor array 130 comprises applying the known magnitude of a current pulse $i_s(t)$ to the memristor array 130 after selecting a memristor by a switch S1; reading-out the voltage value produced by the current pulse $i_s(t)$; and dividing the voltage value by the magnitude of the input current pulse $i_s(t)$.

Furthermore, restoration is accompanied to prevent the resistance of the memristor from deviating away from the originally stored value.

Furthermore, the steps of restoring the resistance value of the selected memristor to the originally stored resistance value can comprise the steps of applying the same currents is(t) both to the selected memristor of the memristor array and to the reference resistor array; generating the current pulse iP(t) whose pulse width is proportional to the difference between the voltage of the selected memristor of the memristor array and the voltage of the node of the resistor array which is the closest to the voltage of the selected memristor, from among voltages of the respective nodes of the reference resistor array which are generated by the applied current is(t); applying the current pulses iP(t) to the selected memristor in the direction in which the resistance value of the selected memristor approaches the resistance which is the closest to that of the selected memristor, from among the respective nodes of the reference resistor array.

Meanwhile, to achieve the above object, according to another embodiment of the present invention, there is provided the write-in circuit which comprises current source; a reference resistor array; a memristor array; and write-in processing unit for selecting any one of nodes of the reference resistor array, selecting any one of memristors of the memristor array, and then generating current pulses with an input current source so that the identical current pulses is(t) are applied both to the reference resistor array and to the selected memristor of the memristor array and adjusting the resistance of the memristor so that the resistance value at the selected node of reference resistor array is written in the selected memristor.

The write-in processing unit 240 may comprise switch arrays s1 and S4 configured to select any one of the memristors of the memristor array 230 and any one of the nodes of the reference resistor array 220; current mirrors cooperating with the input current source 210 and configured to supply identical current pulses $i_s(t)$ to the reference resistor array 220 selected by the switch arrays S4 and the selected memristor of the memristor array 230; differential amplifiers $\text{Diff}_1$ to $\text{Diff}_k$ configured to calculate a difference between a voltage value of the selected node of the reference resistor array 220 and a voltage value of the selected memristor of the memristor array 230 which are produced by the identical current pulses $i_s(t)$ supplied by the current mirrors; sample and hold circuits (S/H) configured to sample and hold the difference voltages of between the selected reference node of the resistor array 220 and the selected memristor of the memristor array 230, being synchronized to clock pulses, until the programming current pulses which are produced by PWMs are ended; an absolute difference circuit (Abs Diff) which computes the absolute difference value between two output signals of the sample and hold circuits and is provided to the input current source 210 to repeat the pulse generation so long as the difference of the outputs of two sample and hold circuits is not close to zero; a comparator configured to compare the outputs of two sample and hold circuits and produces a digital output; two pulse width modulators configured to generate a pulse of the width which is proportional to the magnitude of the outputs of the sample and hold circuits; and transistors configured to supply programming current pulses to the selected memristor of the memristor array 230 so that the resistance of the selected memristor approaches to that of the selected reference resistance, when the switch S2 or S3 is switched and the pulse width modulators generate the pulse.

On the other hand, to achieve the above object, according to yet another embodiment of the present invention, there is provided a read-out/restoration circuit for memristor-based multilevel memories, comprising a current source 310; a reference resistor array 320; a memristor array 330; and a restoration processing unit 340 for selecting any one of nodes of the reference resistor array, selecting any one of memristors of the memristor array, and then restoring a resistance value of the selected memristor to the originally stored resistance value, by initiating the current source so that the current source applies the same current pulse $i_s(t)$ both to the reference resistor array and to the selected memristor of the memristor array then restoring the resistance value of the selected memristor to an originally stored resistance value, by applying the programming current pulse $i_P(t)$ whose width is determined by PWMs so that the resistance value of the selected memristor becomes equal to the closest value among the voltages appeared at the nodes of the reference resistor array if the resistance value written in the selected memristor is not close enough to any of the reference resistance values.

The restoration processing unit 340 may comprise a switch arrays S1 and S4 configured to select any one of the memristors of the memristor array 330 and any one of the nodes of the reference resistor array 320, respectively; current mirrors Q1 to Q3 configured to supply identical current pulses $i_s(t)$ both to the memristor selected by the switch array S1 and to the reference resistor array 320 with an input current source 310; differential amplifiers $\text{Diff}_1$ to $\text{Diff}_k$ configured to calculate the differences between each voltage value of each node of the reference resistor array 320 and the voltage value of the selected memristor of the memristor array 330, which are produced by the identical current pulses $i_s(t)$ supplied by the current mirrors; negative signal excluding circuits N_Excld configured to exclude negative (−) voltages from the voltage value of positive (+) sign output terminals and voltage values of negative (−) sign output terminals, outputted by the differential amplifiers $\text{Diff}_1$ to $\text{Diff}_k$; two minimum value selection circuits MIN A and MIN B configured to select the minimum voltage values among the outputs of the negative signal excluding circuits N_Excld which are from the positive (+) sign output terminals of the differential amplifiers $Diff_1$ to $Diff_k$ and from the negative (−) sign output terminals of the differential amplifiers $Diff_1$ to $Diff_k$ from which the negative (−) voltage has been excluded by the negative signal excluding circuit N_Excld; sample and hold circuits (S/H) configured to sample and hold the outputs of the minimum circuits MIN A and MIN B being synchronized to clock pulses, until the programming current pulses which are produced by PWMs are ended; a comparator C1 configured to compare the outputs of above mentioned two minimum value selection circuits MIN A and MIN B, and generate a logic 1 signal or a logic 0 signal depending upon the comparison result between the outputs of the minimum value selection circuits MIN A and MIN B; two pulse width modulators PWMs configured to generate the pulses of the widths which are proportional to the magnitudes of the outputs of the minimum value selection circuits MIN A and MIN B; switches S1 and S3 switched by the pulses generated by the comparator C1, which choose one between the outputs of two PWMs; and transistors Q4 and Q5 configured to supply the programming current pulses of which widths are proportional to the difference between the voltage of the selected memristor and the closest one to the voltage of the selected memristor among voltages of the nodes of the reference resistor array 320, when the switch is switched and the pulse width modulators PWM generate the current pulses.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF EMBODIMENTS

Reference will be now made in detail to the preferred embodiment of the present invention with reference to the attached drawings.

Characteristics of Memristors

The principle of the memristor is based on the nonlinear property of basic circuit elements. In the relationships defining basic circuit elements, charge is defined as the time integral of current, namely, $$q(t) = \int_{-\infty}^{t} i(\tau) d\tau \tag{1}$$

Equivalently, the current i is the time derivative of the charge q; namely, $$i = \frac{dq}{dt} \tag{2}$$

Similarly, the flux is $\phi$ is defined as the time integral of voltage; namely, $$\phi(t) = \int_{-\infty}^{t} v(\tau) d\tau \tag{3}$$

Equivalently, the voltage v is the derivative of the flux; namely $$v = \frac{d\varphi}{dt} \tag{4}$$

Dividing (4) by (2), we obtain the resistance $$R = \frac{v}{i} \tag{5}$$
$$= \frac{d\varphi}{dt} \cdot \frac{dt}{dq}$$
$$= \frac{d\varphi}{dq}\bigg|_{q=q_Q}$$

Figure 1:
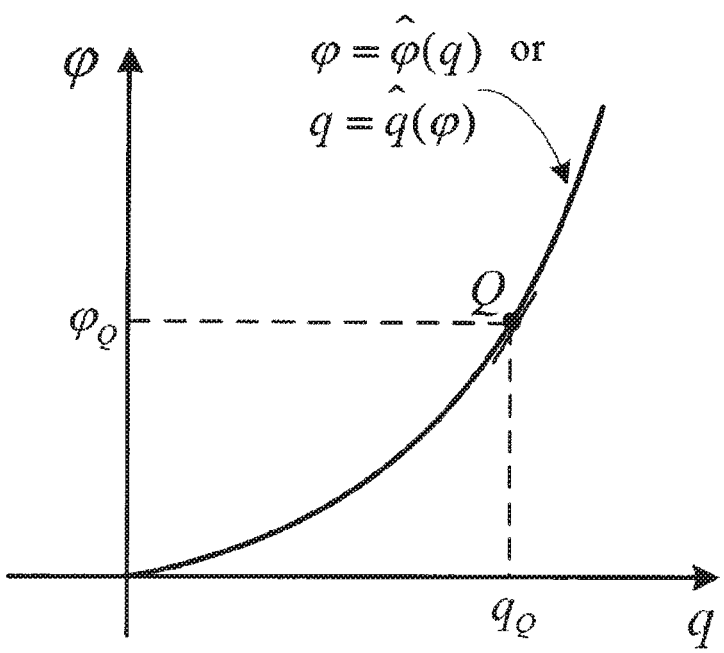
FIG. 1 is a graph of nonlinear functions defining a memristor, where $\hat{q}(\bullet)$ is the inverse function of $\hat{\phi}(\bullet)$. (a) a nonlinear function between the flux $\phi$ and the charge q (b) small-signal resistance obtained by taking the slope at $q=q_Q$, and re-plotting it in terms of $\phi$ via $q=\hat{q}(\phi)$, where $\hat{q}(\phi)=\hat{\phi}^{-1}(\phi)$. Graphically, the "inverse" function $\hat{\phi}^{-1}(\phi)$ is obtained trivially by identifying the coordinate $\phi_Q$ from $(q_Q, \phi_Q)$ instead of $q_Q$.
Figure 1:
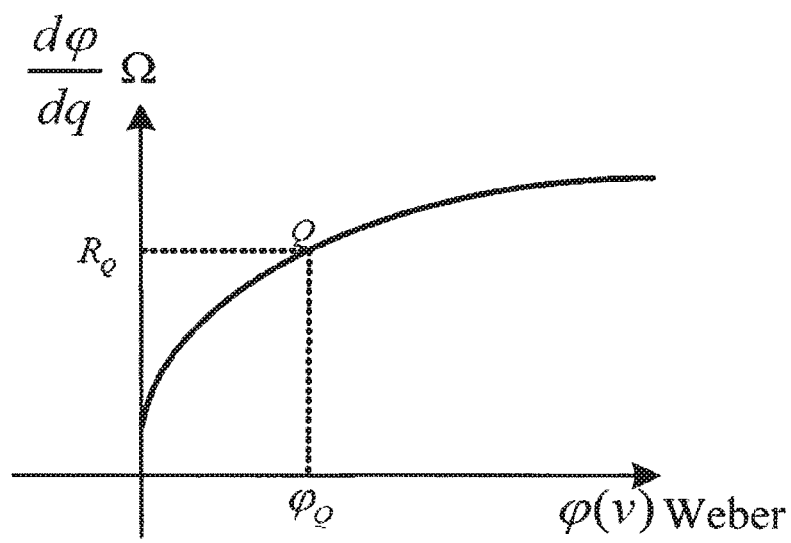

Thus, the resistance can be interpreted as the slope at an operating point on the $\phi$-q curve. If the $\phi$-q curve is nonlinear, the resistance will vary with the operating point. For instance, if the $\phi$-q curve is the nonlinear function shown in FIG. 1(a), its small-signal resistance can be obtained by re-plotting it as a function of $\phi_Q$ in the R vs. $\phi$ plane as in FIG. 1(b).

Since the flux $\phi$ is obtained by integrating the voltage, the resistance of the memristor can be adjusted by applying a voltage signal across the memristor, where $$R = \frac{d\varphi}{dq}\bigg|_{q_Q} \tag{6}$$
$$= \frac{d\varphi}{dq}\bigg|_{\varphi=\hat{\varphi}(q_Q)}$$

If there is an initial flux $\phi_0$, then the flux is computed by adding the incremented flux to $\phi_0$; namely, $$\phi(t)=\phi_0+\int_0^t v(\tau)d\tau \tag{7}$$

Figure 2:
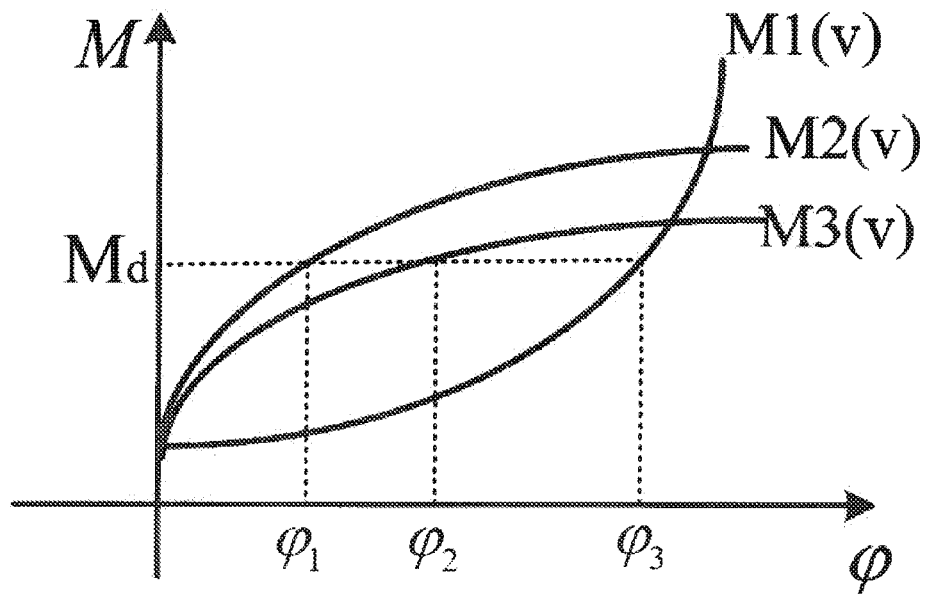
FIG. 2 is the graph to show the fact that different amount of fluxes (voltages) are needed to obtain the same resistance if the memristors have different characteristics.

The above memristance tuning method assumes an ideal operating condition. In practice, there are some problems that must be overcome. The first problem is caused by the nonlinearity between the applied voltage and the corresponding resistance. Suppose the resistance characteristics of the memristors is different from each other as shown in FIG. 2, where the resistance $R_d$ is obtained at different values of $\phi$ such as $\phi_1$, $\phi_2$, and $\phi_3$. If the same magnitude of voltage pulses is chosen, then the durations of the pulse widths for obtaining the same resistance will be different depending on the characteristics of the memristors.

Another problem comes from the fact that the operating point and its associated memristance would be changed whenever some voltage is applied across the memristor. The voltage applied for read-out, or even noise voltages, would be integrated, which causes the flux $\phi$ to be altered. Again, this causes the programmed resistance to be varied. Chua had suggested applying a voltage doublet with equal positive and negative read-out pulses to resolve such problem.

However, the problem remains if the positive and the negative pulses are not perfectly identical due to the non-ideal pulse-generation circuits.

Embodiments of the Present Invention

Figure 3:
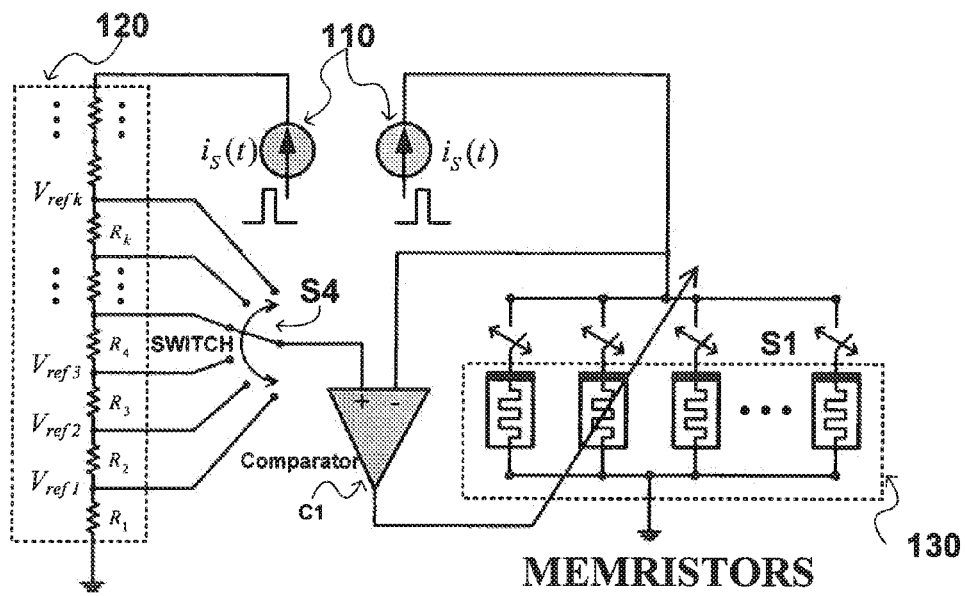
FIG. 3 is the diagram to show the principle of the reference resistor array-based memristor programming (tuning) according to the present invention.

The present invention guarantees the operating point of the memristor to maintain its desired location (or resistance value) by allowing a set of pre-determined multiple resistance levels. FIG. 3 shows the basic idea of the present invention, where the reference resistor array 120 to be referenced and the selected memristor in the memristor array 130 to be programmed (tuned) are shown. Further, reference numeral 110 denotes current sources, S1 denotes switches, and C1 denotes a comparator. The memristors in memristor array 130 are resistor memory devices having a varying resistance values when current or voltage is supplied thereto and it can includes ReRAM, RRAM, and so on.

The goal is to have a selected memristor in the memristor array 130 keep any of the resistance level selected from the reference resistor array 120. If a predetermined magnitude of the current pulse $i_s(t)$ is applied to the reference resistor array 120, different levels of voltages $V_k$ will appear at each node of the reference resistor array 120.

The same current pulse $i_s(t)$ is also applied to a selected memristor in the memristor array 130. The programming (tuning) of the selected memristor in the memristor array 130 is performed by applying programming current pulse $i_P(t)$ to the selected memristor in the memristor array 130 with the appropriate directions until the voltage of the selected memristor in the memristor array 130 equals to that of the selected node voltage in the reference resistor array 120. If the voltage of the selected memristor in the memristor array 130 reaches that of the selected node, the resistance value of the selected memristor in the memristor array 130 becomes the same as the partial sum of the resistance from the ground to the selected node of the reference resistor array 120.

The reference resistor array 120 is not specially limited, but preferably can be implemented by connecting a plurality of resistors in series as shown in FIG. 3 or by forming tab in middle of a resistant line so that the resistor serial connection effect can be obtained.

In addition, assuming that a circuit is constructed in the form of a memristor array 130, a method of writing a reference resistance value in the selected memristor in the memristor array 130 is described below. First, the same current $i_s(t)$ is applied to the reference resistor array 120 and the memristor selected from among the memristors of the memristor array 130. If the voltage of a selected node of the reference resistor array 120 is not equal to the voltage of the memristor selected from the memristor array 130, programming current pulses $i_P(t)$ with appropriate polarities are applied to the memristor to adjust the resistance of the memristor. Finally, the resistance value of the selected memristor in the memristor array 130 is made identical to a reference resistance value of the selected node of the reference resistor array 120. Accordingly, a reference resistance value can be written in the selected memristor in the memristor array 130.

Meanwhile, if the reference resistance value written in the selected memristor in the memristor array 130 is deviated from an original reference resistance value, the original reference resistance value can be restored in the memristor by making the resistance value of the selected memristor in the memristor array 130 equal to the reference resistance value at the node of the reference resistor array 120.

The resistance of the memristor can be changed easily by applying read-out pulses. In this case, assuming that a circuit is constructed in the form of a memristor array 130, a method of restoring a reference resistance value, written in the memristor, to an original reference resistance value is described below. First, in order to read a resistance value written in the memristor, a current pulse is applied to the memristor. The same current pulse $i_s(t)$ as applied to the memristor is also applied to the reference resistor array 120. If the voltage of the memristor is different from that of the reference resistor array 120, it means that the resistance stored in the memristor is different from that at the selected node of the memristor. Next, in this case, programming current pulses $i_P(t)$ are applied to the selected memristor in the memristor array 130 such that the voltage of the memristor approaches the voltage of a node, which is the closest to the voltage of the memristor, from among the voltages of the respective nodes of the reference resistor array 120 which are generated by the applied current pulse. Consequently, the resistance value of the memristor becomes identical to the resistance value of the reference resistor array 120 which is the closest to the resistance value of the memristor. Accordingly, the reference resistance value can be restored to the originally programmed resistance value, which is the resistance at one of node of the reference resistor array 120.

Here, a method of applying the programming current pulses to the memristor is that the current pulses $i_P(t)$, having a pulse width which is proportional to the difference between the resistance value of the memristor and the target resistance value, is supplied to the memristor in a direction in which the resistance value of the memristor approaches a target resistance value with consideration of a direction in which the resistance value of the selected memristor in the memristor array 130 is increased and a direction in which the resistance value of the selected memristor in the memristor array 130 is decreased.

This idea is employed in both the write-in and the read-out/restoration circuits. The detailed description of these circuits will be presented in the following sections.

Memristor Write-in Circuit

The present memristor write-in circuit is used to bias the memristor at a desired resistance level. The importance of this circuit is that it guarantees robustness in resistance values regardless of the characteristic differences among the memristors. To achieve this goal, the memristor to be written and the voltage to be referenced are selected first. Then, a sequence of pulses is generated to adjust the resistance of the selected memristor toward the selected reference resistance until they are equal. A possible example of the write-in circuit is illustrated in FIG. 4.

Figure 4:
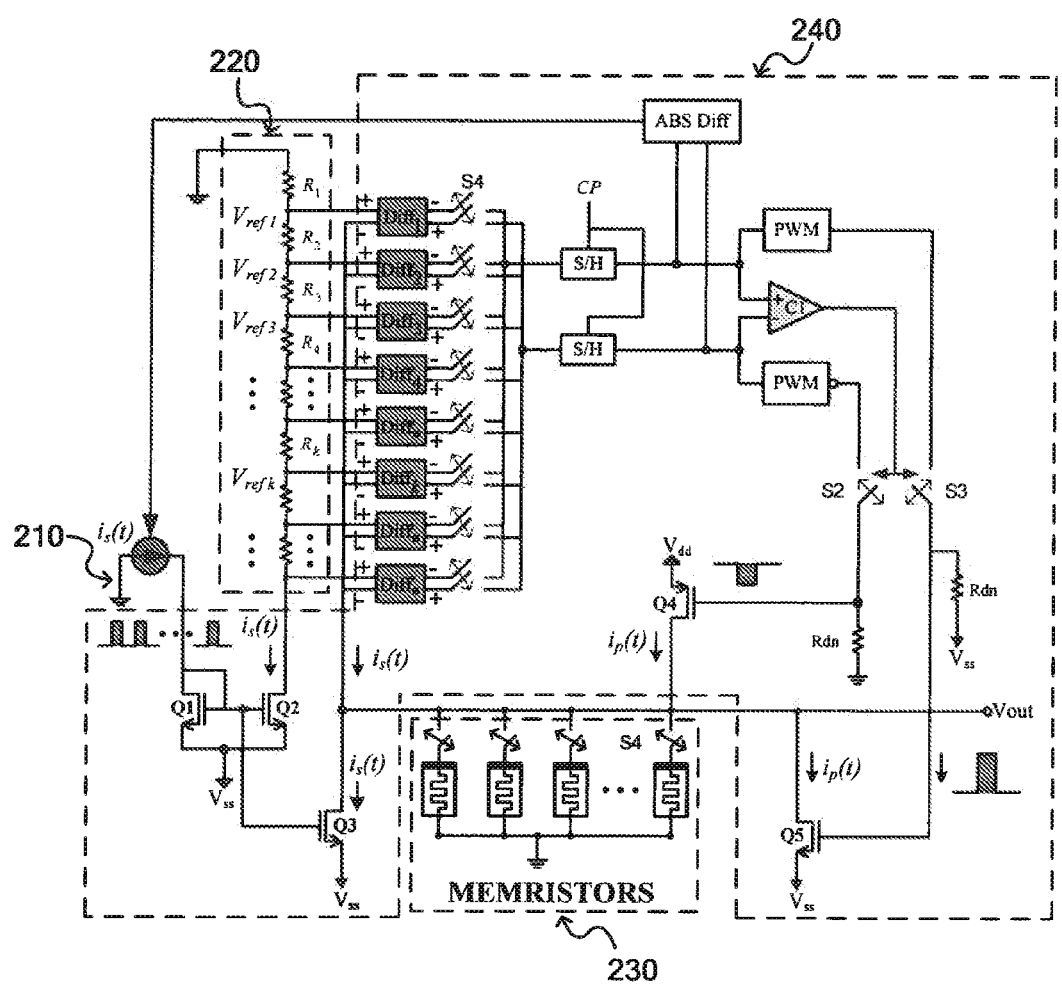
FIG. 4 is a view showing an example of write-in memristor circuit for the memristor-based multilevel memory according to the present invention.

As shown in FIG. 4, a write-in circuit for a memristor-based multilevel memory according to another embodiment of the present invention chiefly includes a current source 210, a reference resistor array 220, a memristor array 230, and a write-in processing unit 240 for selecting any one of the nodes of the reference resistor array 220, selecting any one of the memristors of the memristor array 230, and performing operation so that the current source 210 applies current to the reference resistor array 220 and the selected memristor of the memristor array 230 and so a reference resistance value according to the selected node of the reference resistor array 220 is written in the selected memristor with a resistance value of the selected memristor equal to the reference resistance value.

The write-in processing unit 240 includes switch arrays S1 and S4 for selecting any one of the memristors of the memristor array 230 and any one of the nodes of the reference resistor array 220, respectively, and a processing unit 240. The processing stage includes differential amplifiers $Diff_1$ to $Diff_k$, Sample and Hold (S/H) circuits, absolute differential amplifier denoted as (Abs Diff), pulse width modulators PWM, transistors Q1 to Q5, switches S2 and S3, and a comparator C1 for writing a reference resistance value according to a node selected by the switch array S4, from among the nodes of the reference resistor array 220, in a memristor selected by the switch array S1, from among the memristors of the memristor array 230 in the state in which the resistance value of the selected memristor becomes equal to the reference resistance value. More particularly, the processing unit 240 controls the current source 210 with the output of (Abs Diff) circuit so that it generates and applies the identical current pulses to a node selected by the switch array S4, from among the nodes of the reference resistor array 220, and a memristor selected by the switch array S1, from among the memristors of the memristor array 230.

The voltage difference between the selected reference node of the resistor array 220 and the selected memristor of the memristor array is computed in differential amplifier Diff. The signals from the positive (+) and the negative (−) terminals of the selected differential amplifier are sampled and hold by the sample and hold (S/H) circuits until the programming current pulses $i_P(t)$ which are produced by PWMs are ended.

Two pulse width modulators, PWMS, generate pulses of the widths which are proportional to the magnitudes of the corresponding outputs of the sample and hold circuits. The output pulses of the PWMs are utilized to program the selected memristor to have the resistance of the memristor approach to that of the resistance at the selected node of the reference resistor array 220.

Meanwhile, the difference of the two output signals of the sample and hold circuits is also computed by an absolute differential amplifier (Abs Diff). As the result, if the output of the (Abs Diff) is not so small, which is the case that the voltage of the selected node of the reference resistor array 220 is not close to the voltage of the selected memristor of the memristor array 230, the processing unit 240 controls the current source 210 to apply the input current pulses $i_s(t)$ repeatedly until the two voltages become equal. Consequently, the reference resistance value is written in the selected memristor in the state in which the resistance value of the selected memristor equals to the reference resistance value according to the selected node of the reference resistor array 220.

In FIG. 4, a $R_{dn}$ denotes pull-down resistor, a $V_{Refk}$ denotes a reference voltage of a node k, $R_k$ denotes a $k^{th}$ reference resistor, $V_{ss}$ denotes a negative voltage source, $V_{dd}$ denotes a positive voltage source, $i_s(t)$ denotes an initial current pulse, and $i_P(t)$ denotes a programming current pulse.

The principle that the reference resistance value is written in the memristor is described in detail below.

The first step is to choose the write-in memristor and the resistance value to be memorized by turning on one of the switches in switch array S1 of FIG. 4 and the corresponding switch pair in switch array S4, respectively. Then, an initial current pulse $i_s(t)$ is applied at the drain of the transistor Q1 so that its mirrored current pulses appear at transistors Q2 and Q3. With this current pulse $i_s(t)$, negative voltages appear at both the selected reference nodes, and at the output terminal $V_{out}$ of the memristors.

Let us denote the sum of the resistances from ground to the node k by $R_k^{SUM}$. Then, $$R_k^{SUM} = \sum_{i=1}^{k} R_i \tag{8}$$

This is the resistance level at node k from which every memristor must refer to. The voltage $V_k(t)$ across node k is;

$$V_k(t) = R_k^{SUM} i_s(t) \tag{9}$$

This is the voltage version of the reference value at node k.

Also, let the $j^{th}$ memristor be selected and its memresistance (resistance of the memristor) be $M_j$. Then, the output voltage $V_{out}(t)$ of the selected memristor is $$V_{out}(t) = M_j i_s(t) \tag{10}$$

To write the resistance $R_k^{SUM}$ to a memristor, we have to force the difference between $V_k(T_P)$ and $V_{out}(T_P)$ to zero by changing the memristance $M_j$.

To do this, the difference between $V_k(T_p)$ and $V_{out}(T_p)$, is computed by the associated differential amplifier, $Diff_k$. The symbol Diff denotes the differential amplifier used to compute the voltage difference between $V_k(t)$ and $V_{out}(t)$. If the output is sampled at time $T_p$ which is the center of the current pulse, then the value of $Diff_k$ computed at its output terminals is given by;

$$\begin{aligned} Diff_k^+ &= V_k(T_p) - V_{out}(T_p) \\ &= R_k^{SUM} i_s(T_p) - M_j i_s(T_p) \\ &= (R_k^{SUM} - M_j) i_s(T_p) \end{aligned} \tag{11}$$

and $$\begin{aligned} Diff_k^- &= -Diff_k^+ \\ &= -(V_k(T_p) - V_{out}(T_p)) \end{aligned} \tag{12}$$

where $Diff_k^+$ and $Diff_k^-$ are the output voltages of the differential amplifier $Diff_k$ at the positive and the negative terminals, respectively.

The voltage difference between the selected reference node of the resistor array 220 and the selected memristor of the memristor array 230 is computed in differential amplifier Diff. The output of the sample and hold circuit is sampled and kept in the sample and hold circuit (S/H) until the programming current pulses $i_P(t)$ which are produced by PWMs are ended.

The positive (+) and the negative (−) outputs of the selected differential amplifier is sampled and hold by the sample and hold circuit (S/H) until the programming current pulses $i_P(t)$ which are produced by PWMs are ended.

Suppose the selected memristance $M_j$ is less than the referenced sum of the resistances $R_k^{SUM}$ in FIG. 4. In this particular case, $\text{Diff}_k^+$ is smaller than $\text{Diff}_k^-$ since $V_{out}(T_p)$ is less negative than that of $V_k(T_p)$. After passing through the S/H circuits, these $\text{Diff}_k$ outputs cause the comparator C1 to generate a logic 1 signal. Note that the negative and the positive output terminals of $\text{Diff}_k$ are linked to the positive and the negative input terminals of C1, respectively. As a consequence, switch S3 is turned on.

At the same time, a negative pulse corresponding to the magnitude of $\text{Diff}_k^+$ is generated by the upper Pulse Width Modulator (PWM). This positive pulse produced by the upper pulse width modulator PWM is fed into transistor Q5 by the switch S3. As a consequence, the transistor Q5 is turned on and current $i_P(t)$ is forced to flow through the selected memristor. The voltage generated by this current is integrated via (7) and increases the flux $\phi$. With such increased flux $\phi$, the increment of the memristance can be obtained with a monotonically increasing function via the R vs. $\phi$ graph in FIG. 1(b). As a consequence, the memristor voltage decreases toward the selected reference level, which means the resistance of the memristor is increased.

The processing from the input current pulse generation repeats until the difference between $V_k(T_p)$ and $V_{out}(T_p)$ becomes zero with the control of the output of the (Abs Diff) circuit, thereby completing the "write-in" processing of the reference resistance $R_k^{SUM}$.

On the other hand, suppose the selected memristance $M_j$ is larger than the referenced sum $R_k^{SUM}$ of the resistances, which corresponds to the case where the memristor voltage $V_{out}(T_p)$ is more negative than that of referenced resistor, $V_k(T_p)$. In this case, $\text{Diff}_k^+$ is larger than $\text{Diff}_k^-$. Therefore, the negative input terminal of C1 becomes larger than that of the positive input terminal of C1, which results in the comparator C1 generating a logic 0 signal. As a consequence, switch S2 is turned on.

At the same time, a negative pulse corresponding to the magnitude of $\text{Diff}_k^-$ is generated by the lower Pulse Width Modulator (PWM). This negative pulse which is produced by the lower pulse width modulator PWM is fed into transistor Q4 by switch S2. As a consequence, the transistor Q4 is turned on, which force current $i_P(t)$ to flow down through the selected memristor. This causes the memristance of the selected memristor to decrease, and the memristor voltage to increase toward the selected reference level.

The above comparison between the voltages and the adjustment of the memristance are repeated with the control of the output of the (Abs Diff) circuit until the memristor voltage is equal to its selected reference voltage level.

Memristor Read-Out/Restoration Circuit

Our memristor read-out/restoration circuit is used to read the content of the memristor by applying an appropriate interrogating current or voltage. The critical function of this circuit is to guarantee the memristor will stay at a set of fixed values without being perturbed when a read-out voltage, or a noise voltage, is applied across the memristor. To achieve this goal, a single compensating pulse is applied to have the memristance changed toward the closest reference resistance after the initial read-out pulse is applied. The read-out circuit is the same as the write-in circuit except the negative signal excluding circuit N_Excld, MIN A and MIN B circuits shown in FIG. 5.

Figure 5:
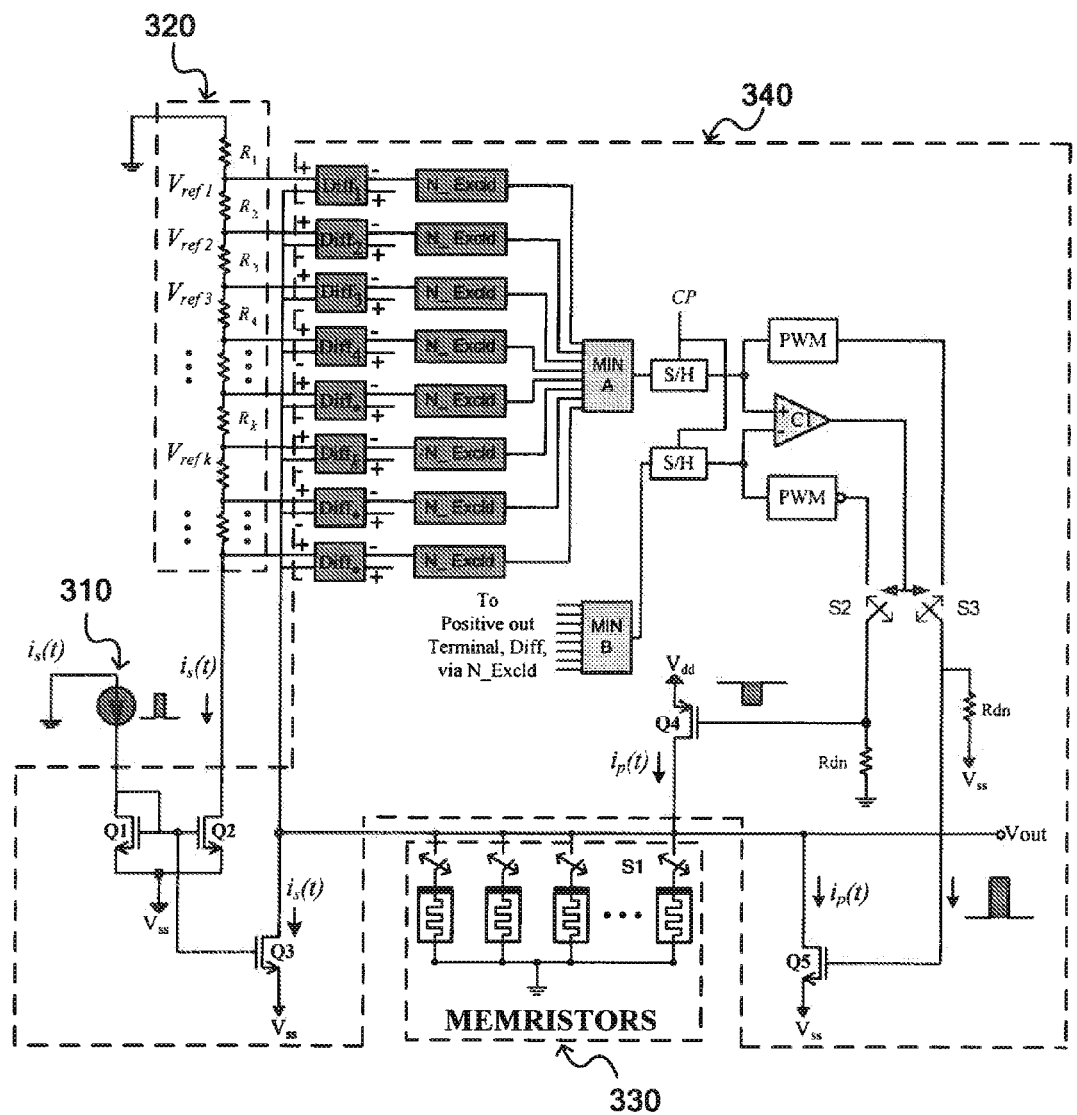
FIG. 5 is a view showing an example of read-out/restoration circuit of the memristor-based multilevel memory with reference resistor array (a) overall read-out/restoration circuit, (b) negative signal excluding circuit N_Excld circuit which chooses only the positive signal according to the present invention.
Figure 5:
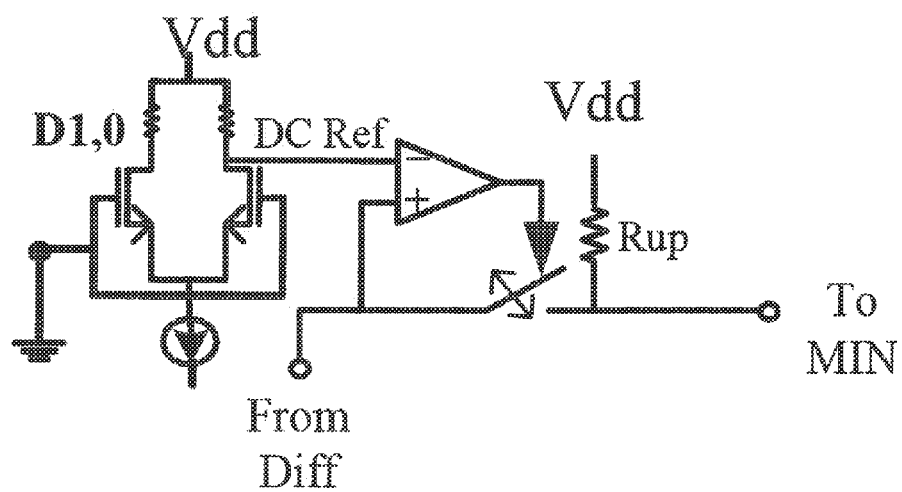

That is, as shown in FIG. 5, the read-out/restoration circuit for the memristor-based multilevel memory according to another embodiment of the present invention chiefly includes a current source 310, a reference resistor array 320, a memristor array 330, and a restoration processing unit 340. The restoration processing unit 340 selects any one of the nodes of the reference resistor array 320, selects any one of the memristors of the memristor array 330, and performs operation so that the current source 310 applies current $i_s(t)$ to the reference resistor array 320 and the selected memristor of the memristor array 330 in order to read-out the contents of the memristor and, at the same time, restore an originally stored resistance value if it is deviated, in such a manner that the resistance value of the selected memristor becomes equal to a reference resistance value according to the selected node of the reference resistor array 320 and that the resistance value of the selected memristor becomes equal to the reference resistance value of the reference resistor array 320 when the reference resistance value written in the selected memristor is deviated from an original reference resistance value.

The restoration processing unit 340 may comprise a switch array S1 configured to select any one of the memristors of the memristor array 330 in order to read the resistance value written in the selected memristor; current mirrors Q1 to Q3 configured to supply identical current pulses $i_s(t)$ both to the memristor selected by the switch array S1 and to the reference resistor array 320 with an input current source 310; differential amplifiers $\text{Diff}_1$ to $\text{Diff}_k$ configured to calculate the differences between each voltage value of each node of the reference resistor array 320 and the voltage value of the selected memristor of the memristor array 330, which are produced by the identical current pulses $i_s(t)$ supplied by the current mirrors; negative signal excluding circuits N_Excld configured to exclude negative (−) voltages from the voltage value of positive (+) sign output terminals and voltage values of negative (−) sign output terminals, outputted by the differential amplifiers $\text{Diff}_1$ to $\text{Diff}_k$; minimum value selection circuits MIN A and MIN B configured to select the minimum voltage values among the outputs of the negative signal excluding circuits N_Excld which are from the positive (+) sign output terminals of the differential amplifiers $\text{Diff}_1$ to $\text{Diff}_k$ and from the negative (−) sign output terminals of the differential amplifiers $\text{Diff}_1$ to $\text{Diff}_k$ from which the negative (−) voltage has been excluded by the negative signal excluding circuit N_Excld; sample and hold circuits (S/H) configured to sample and hold the outputs of the minimum circuits MIN A and MIN B being synchronized to clock pulses, until the programming current pulses $i_P(t)$ which are produced by PWMs are ended; a comparator C1 configured to compare the outputs of above mentioned two minimum value selection circuits MIN A and MIN B, and generate a logic 1 or a logic 0 pulse depending upon the comparison result between the outputs of the minimum value section circuits MIN A and MIN B; two pulse width modulators PWMs configured to generate the pulses of the widths which are proportional to the magnitudes of the outputs of the minimum value selection circuits MIN A and MIN B; switches S1 and S3 switched by the pulses generated by the comparator C1, which choose one between the outputs of two PWMs; and transistors Q4 and Q5 configured to supply the programming current pulses $i_P(t)$ of which widths are proportional to the difference between the voltage of the selected memristor and the closest one to the voltage of the selected memristor among voltages of the nodes of the reference resistor array 320, when the switch S2 or S3 is switched and the pulse width modulators PWM generate the current pulses $i_P(t)$.

The current pulses $i_P(t)$ generated by the pulse width modulator PWMs are applied to the selected memristor so that the voltage of the selected memristor approaches the voltage of a node which is the closest to the voltage of the selected memristor, from among the voltages of the respective nodes of the reference resistor array 320 which are generated by the applied current $i_s(t)$. Consequently, since the resistance value of the selected memristor becomes equal to the resistance value of the reference resistor array 320 which is the closest to the resistance value of the selected memristor, the resistance value of the selected memristor can be restored to the originally stored resistance value, which is the resistance at one of node of the reference resistor array 320.

In FIG. 5, $R_{dn}$ denotes a pull-down resistor, $V_{Ref k}$ denotes the reference voltage of a node k, $R_k$ denotes a $k^{th}$ reference resistor, $V_{ss}$ denotes a negative voltage source, $V_{dd}$ denotes a positive voltage source, $i_s(t)$ denotes an initial current pulse, and $i_P(t)$ denotes a programming current pulse.

The read-out from the memristor and the restoration of the original reference value are performed as follow.

Firstly, the memristor to read-out is addressed by turning on one of the switches in switch array S1. Then, an initial current pulse $i_s(t)$ is applied at the drain terminal of the transistor Q1 so that the mirrored current pulses appear at transistors Q2 and Q3. With these current pulses, negative voltages will appear at all reference nodes and the output terminal, $V_{out}$, of the selected memristor.

After the read-out operation, the memristor resistance is adjusted as follow; The sum $R_k^{SUM}$ of the resistance and its voltage $V_k(t)$ at each node are computed via (8) and (9), respectively as in the write-in circuit. Also, the voltage differences, $Diff_k^+$ and $Diff_k^-$, between each $V_{ref k}$ and $V_{out}$ are computed via (11) and (12), respectively.

The next step is to choose only the positive signals from $Diff_k^+$ or $Diff_k^-$ using the negative signal excluding circuit N_Excld by comparing between the DC voltage and the output of the Diff circuit as shown in FIG. 5(b). When the signal from the differential amplifier Diff is negative, the switch included in the circuits blocks the connection. Thus, only positive signals from either the negative terminals, or the positive terminals, of the differential amplifiers $Diff_1$ to $Diff_k$ are fed into either MIN A or the MIN B circuit, respectively.

The circuits MIN A and MIN B together with the comparator C1 are used to choose the smallest absolute value among, all $Diff_k^+$ and $Diff_k^-$ signals; The MIN A circuit is used to choose the smallest positive signal among all the $Diff_k^-$s which are computed with $-(V_k(T_p)-V_{out}(T_p))$. Also, the MIN B circuit is used to choose the smallest positive signals among the $Diff_k^+$s which are computed via $V_k(T_p)-V_{out}(T_p)$.

If the output of MIN A is smaller than that of MIN B, then, the memristor voltage is higher than that of its closest reference voltage (with $M_j<R_k^{SUM}$). In this case, the memristance $M_j$ should be increased. On the other hand, if the output of the MIN A is larger than that of MIN B, then the memristor voltage is smaller than that of its closest reference voltage (with $M_j>R_k^{SUM}$). In this case, $M_j$ should be decreased.

To achieve this goal, the sample and hold circuits (S/H) sample and hold the outputs of the minimum circuits MIN A and MIN B being synchronized to clock pulses, until the programming current pulses $i_P(t)$ which are produced by PWMs are ended. Then, if MIN A is smaller than that of MIN B, the comparator C1 produces a logic 1 signal and switch S3 is turned on. Meanwhile, the upper pulse width modulator PWM which is connected to the MIN A generates a positive pulse whose width is proportional to the absolute value of the output of MIN A. The positive pulse is fed to Q5 via S3. This forces the current $i_P(t)$ to flow in an upward direction through the addressed memristor in FIG. 5(a). This increases the memristance of the addressed memristor and decreases the output voltage.

If the output of MIN B is smaller than that of MIN A, then comparator C1 produces a logic 0 signal and S2 is turned on. Meanwhile, the lower pulse width modulator (PWM) which is connected to the MIN B generates a negative pulse whose width is proportional to the absolute value of the output of MIN B. The negative pulse is fed to transistor Q4 via switch S2. This forces the current $i_P(t)$ to flow in a downward direction through the addressed memristor in FIG. 5(a). This, operation decreases the memristance of the addressed memristor and increases the output voltage.

Note that the above adjustment of the memristor is executed only once during each read-out processing.

Performance of the Invention

The write-in circuit and the read-out/restoration circuit of the present invention have been simulated extensively via Matlab. All circuit components are assumed to be ideal. The simulation aims to check if the memristors are written accurately with the prescribed resistance levels, and if the memristor contents are adjusted properly when they are altered by noise, or read-out voltages. Also, we focus on whether our invented circuits are working well when memristors with slightly different characteristics are used in practice. All memristors used in our simulations are mathematical models because physical memristor devices with prescribed φ vs. q characteristics are not commercially available at the moment.

Figure 6:
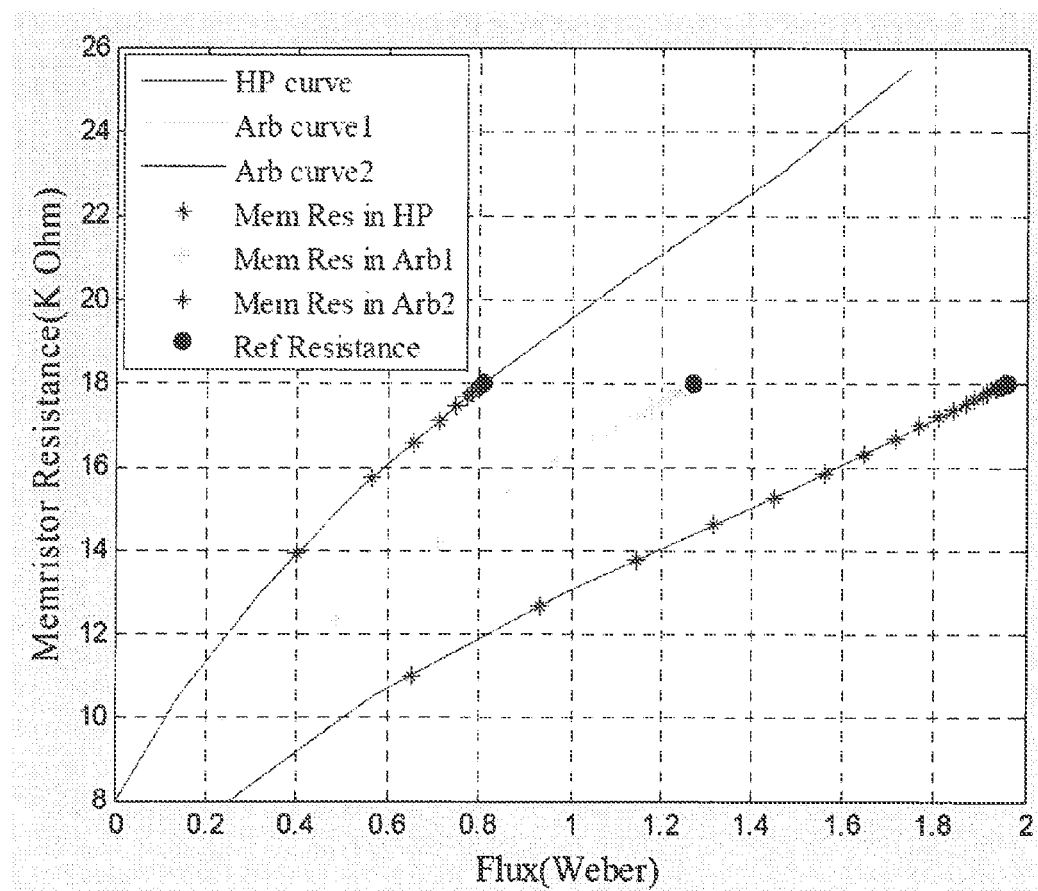
FIG. 6 is an illustration showing the changes in the R-$\phi$ value of 3 different memristors while repeated writing pulses are applied to program (write) and maintain 18 kΩ (level 5). The invented scheme forces all memristors to be written the same information independent of any slight variations in the memristor characteristics.

Our first simulation is designed to test the write-in operation of three memristors with slightly different characteristics. To have our simulation be as close to real experiments as possible, we chose the characteristic curve of the HP memristor and two contrived variations. Our simulation consists of writing a fixed reference resistance of 18 kΩ on the three memristors which have different φ-q characteristics. The initial values of the memristors are randomly selected. FIG. 6 shows the changes in the R-φ values while repeated writing pulses are applied. The relatively larger movements of the lower points of each characteristic curve are due to the big difference between the reference resistance and the initial memristance. Note that the compensation pulse width generated by the pulse width modulator (PWM) is proportional to the difference between the reference resistance and that of the memristor. Also, observe that, depending on its characteristics, different amounts Δφ of the flux φ are required to write and maintain the same resistance level on each memristor. Despite significant differences in the 3 memristor characteristics, the present invention is able to write exactly the same resistance level in all 3 memristors.

Figure 7:
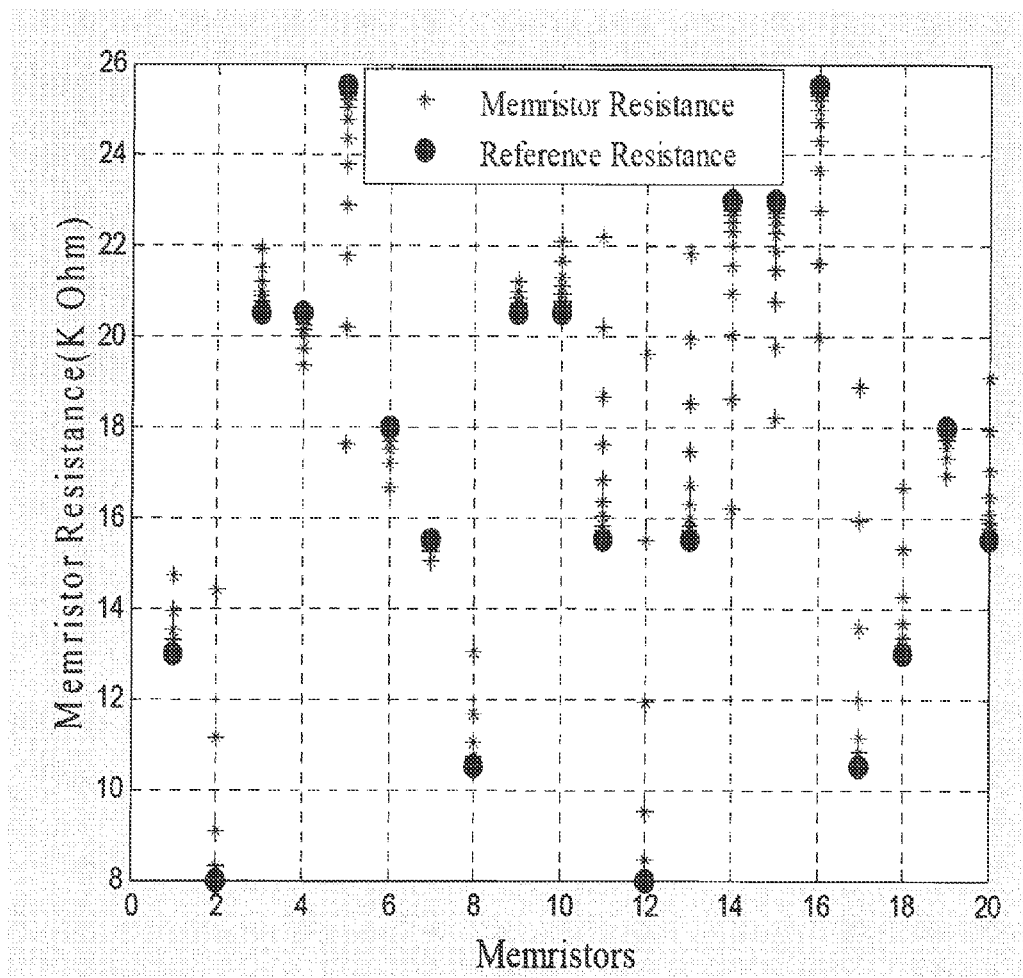
FIG. 7 is an illustration showing changes of resistance values (denoted by blue star marks *) during repeated applications of write-in pulses to 20 memristors (mathematical model); The HP memristor model is used and the initial values are randomly selected (denoted by red dots). The blue star marks * farthest for the red dot is the initial resistance. All memristors memorize successfully the randomly given values regardless of their initial values.

Extensive simulations for testing the write-in function for multiple levels have also been made. The number of levels we have chosen to write-in the memristors is 8 and the model of the memristor used in our simulations is chosen from the HP publication [11] whose resistance ranges from about 8 k Ohm to 25.5 KOhm. The memristors are allowed to have 8 equally spaced resistance levels of {8.0, 10.5, 13, 15.5, 18, 20.5, 23, 25.5} K Ohm as in FIG. 7. Big red dots are the desired writing levels and the initial resistance values are selected randomly. As shown in the figure, all memristor converge successfully to their desired values during repeated applications of our write-in pulses to 20 memristor models.

Figure 8:
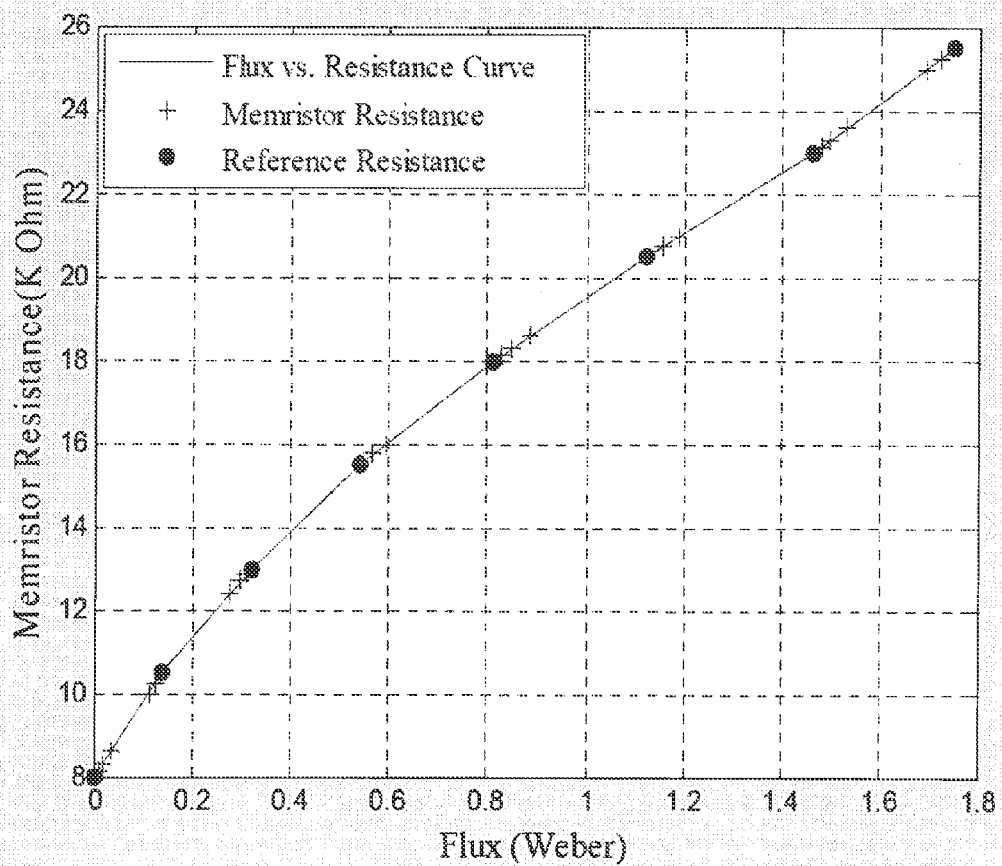
FIG. 8 is a view showing convergence of 8 memristors to 8 prescribed levels while they are read several times; It is assumed that the memristors differ initially by a maximum of 10% from their original levels.

Similar simulations have been made for our read-out/restoration circuit. The goal of this circuit is to have the memristors to stay at fixed values without being perturbed when a read-out voltage, or any noise voltage, is applied across the memristor by applying a single compensating pulse after the initial read-out pulse. Extensive simulations on 8 memristors with 8 slightly different characteristics have been made. The memristors are perturbed initially by a maximum of 10% from their reference resistances. FIG. 8 shows traces of the resistance on the R-φ curve of a typical memristor. The big red dots are the desired levels and the small cross symbols are the traces of the resistance changes while the read-out/restoration operation is performed. Note that a single compensation pulse is generated during each read-out processing. Observe that the resistance values in FIG. 8 converge to their closest levels with the read-out pulses.

As described above, the present invention enables the memristor to be used as multilevel memory by using a reference-resistance-array which constrains the memristor to stick to a set of predetermined fixed reference resistance values. To achieve this goal, two circuits; namely, the write-in and the read-out/restoration circuits are proposed. To write-in the memristor, both the memristor in which information is being written and the voltage level at which the memristor refers to are selected concurrently, and a sequence of pulses is then adaptively generated to change the resistance of the selected memristor toward a desired resistance level.

The read-out/restoration circuit restores the memristance (resistance of the memristor) to its original reference value by using adaptively generated pulses well before the memristor has drifted far away from any one of the reference values.

Advantages and Disadvantages in Comparison to Current and Potential Alternatives to the Invention There are several advantages of the memristor memory over conventional transistor-based memories. One is its strikingly small size. Though memristor is still at its early development stage, its size is at most one tenths of its RAM counterparts [11]. If the fabrication technology for memristor is improved more, the size advantage could be even more significant. Another feature of the memristor is its incomparable potential to store analog information, which enables the memristor to keep multiple bits of information in a memory cell [9], [10]. Besides these features, the memristor is also an ideal device for implementing synaptic weights in artificial neural networks [12], [13].

Best Way of Using the Invention as Well as Possible Variations

The best way of the present invention is obviously to enable the memristor to be utilized as a multilevel memory. If the number of levels of the memory is increased, it could also be used to implement the synaptic weights of neural networks.

A small variant of the present invention could also be used for increasing the number of memory levels of the existing PRAM's or RRAM's.

While some exemplary embodiments of the present invention have been described, the present invention is not to be restricted by the embodiments but only by the appended claims. It is to be appreciated that those skilled in the art can change or modify the embodiments without departing from the scope and spirit of the present invention.

What is claimed is:

1. A method of implementing a memristor-based multi-level memory using a reference resistor array, the method comprising the steps of:
   in a way making a resistance value of the memristor selected from among memristors of a memristor array equal to the reference resistance value of a node selected from among nodes of the reference resistor array, writing the reference resistance value in the selected memristor; and
   when the reference resistance value written in the selected memristor is deviated from the originally stored resistance value, restoring the resistance value of the selected memristor to the originally stored resistance value by making the resistance value of the selected memristor equal to the closest reference resistance value among all the nodes of the reference resistor array.

2. The method as claimed in claim 1, wherein the memristors are all the resistance-based memories, in which ReRAM and RRAM are included.

3. The method as claimed in claim 1, wherein the reference resistor array is implemented by connecting a plurality of resistors in series or forming tabs in middle of a resistant line so that a resistor serial connection effect can be realized.

4. The method as claimed in claim 1, wherein the reference resistance value at the selected node of a reference resistor array is the sum of resistances from a ground to the selected node.

5. The method as claimed in claim 1, wherein the step of writing the reference resistance value of the selected memristor comprises the steps of:
   Step a: applying the same currents $i_s(t)$ to both the reference resistor array and the selected memristor of the memristor array;
   Step b: if the absolute difference value between the voltage of the selected node of the reference resistor array and the voltage of the selected memristor of the memristor array is larger than a predetermined threshold, applying a programming current pulse $i_P(t)$ to the selected memristor of the memristor array 130 and repeating from step a.

6. The method as claimed in claim 5, wherein the step of applying the programming current pulses $i_P(t)$ to the selected memristor comprises the steps of:
   Generating the current pulse $i_P(t)$ whose pulse width is proportional to the difference between the voltage of the selected memristor and that of the selected node among the nodes of reference resistor array;
   applying the current pulses $i_P(t)$ to the selected memristor in a direction in which the resistance value of the selected memristor approaches the resistance of the selected node of reference resistor array.

* * * * *